(12) United States Patent
Patra

(10) Patent No.: US 11,350,513 B2
(45) Date of Patent: May 31, 2022

(54) STOP FOR ARRANGEMENT IN A CONSTRICTION OF AN EUV ILLUMINATION BEAM

(71) Applicant: Carl Zeiss SMT GmbH, Oberkochen (DE)

(72) Inventor: Michael Patra, Oberkochen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 17 days.

(21) Appl. No.: 17/102,976

(22) Filed: Nov. 24, 2020

(65) Prior Publication Data

US 2021/0084741 A1 Mar. 18, 2021

Related U.S. Application Data

(63) Continuation of application No. PCT/EP2019/062845, filed on May 17, 2019.

(30) Foreign Application Priority Data

Jun. 4, 2018 (DE) .......................... 102018208710.5

(51) Int. Cl.
*H05G 2/00* (2006.01)
*G03F 7/20* (2006.01)

(52) U.S. Cl.
CPC ......... *H05G 2/006* (2013.01); *G03F 7/70033* (2013.01); *G03F 7/70833* (2013.01); *H05G 2/008* (2013.01)

(58) Field of Classification Search
CPC .... H05G 2/006; H05G 2/008; G03F 7/70033; G03F 7/70833
See application file for complete search history.

(56) References Cited

U.S. PATENT DOCUMENTS 6,859,515 B2 2/2005 Schultz et al.
8,198,613 B2 6/2012 Moriya et al.
(Continued)

FOREIGN PATENT DOCUMENTS

DE 10 2008 013 229 A1 6/2009
DE 10 2011 015 266 A1 10/2011
(Continued)

OTHER PUBLICATIONS

German Examination Report, with translation, corresponding DE Appl No. 10 2018 208 710.5 for dated Jan. 25, 2019.
(Continued)

*Primary Examiner* — Nicole M Ippolito
*Assistant Examiner* — Hanway Chang
(74) *Attorney, Agent, or Firm* — Fish & Richardson P.C.

(57) ABSTRACT

A stop is configured to be arranged in a constriction of an EUV illumination light beam between an EUV light source for EUV illumination light and an EUV illumination optical unit. The stop has a beam entrance section, a beam exit section and an intervening beam tube section. The entrance section has a cross section that decreases in the propagation direction of the EUV illumination light beam. The cross section of the exit section increases in the propagation direction. The cross section of the tube section is constant. An inner wall of the beam tube section is embodied as reflective for the EUV illumination light. The result is a stop that can have a defined predetermination of the illumination light beam in conjunction with a good thermal loading capacity of the stop.

20 Claims, 3 Drawing Sheets

(56) References Cited

U.S. PATENT DOCUMENTS

| | | |
|---|---|---|
| 8,937,708 B2 | 1/2015 | Endres et al. |
| 9,200,359 B2 | 12/2015 | Katsir et al. |
| 9,298,110 B2 | 3/2016 | Steinhoff et al. |
| 2003/0043455 A1 | 3/2003 | Singer et al. |
| 2004/0058253 A1 | 3/2004 | Endo et al. |
| 2009/0073396 A1 | 3/2009 | Van De Vijver et al. |
| 2011/0026002 A1 | 2/2011 | Loopstra et al. |
| 2011/0242515 A1 | 10/2011 | Ceglio et al. |
| 2015/0015865 A1 | 1/2015 | Endres et al. |

FOREIGN PATENT DOCUMENTS

| | | |
|---|---|---|
| EP | 0 952 491 A2 | 10/1999 |
| EP | 1 225 481 A | 7/2002 |
| WO | WO 2009/074211 A1 | 6/2009 |
| WO | WO 2012/100846 A1 | 8/2012 |

OTHER PUBLICATIONS

Translation of International Search Report for corresponding PCT Appl No. PCT/EP2019/062845, dated Aug. 9, 2019.

"Systems for aligning an image of an extreme ultraviolet (EUV) radiation emitting plasma to an aperture", Research Disclosure, vol. 579, No. 41, Jul. 1, 2012.

STOP FOR ARRANGEMENT IN A CONSTRICTION OF AN EUV ILLUMINATION BEAM

CROSS-REFERENCE TO RELATED APPLICATIONS

The present application is a continuation of, and claims benefit under 35 USC 120 to, international application PCT/EP2019/062845, filed May 17, 2019, which claims benefit under 35 USC 119 of German Application No. 10 2018 208 710.5, filed Jun. 4, 2018. The entire disclosure of these applications are incorporated by reference herein.

FIELD

The disclosure relates to a stop for arrangement at a constriction of an EUV illumination beam between an EUV light source for EUV illumination light and an EUV illumination optical unit. Furthermore, the disclosure relates to an illumination system including such a stop, an optical system including such an illumination system, a projection exposure apparatus including such an optical system, a method for producing a microstructured or nanostructured component using such a projection exposure apparatus, and a component structured using such a production method.

BACKGROUND

The use of an intermediate focus for separating desired light portions from undesired radiation or debris portions is known in association with a projection exposure apparatus from U.S. Pat. No. 9,298,110 B2. US 2009/0073396 A1 discloses a projection exposure apparatus including an interface between a light source and an illumination optical unit. WO 2012/100846 A1 discloses a waveguide structure for use in a projection exposure apparatus. US 2011/0026002 A1 discloses an EUV light source and also an interface between the light source and an illumination optical unit. DE 10 2011 015 266 A1 discloses an EUV collector system including a device for enhancing EUV radiation collection.

SUMMARY

The present disclosure seeks to develop a stop of the type mentioned in the introduction in such a way as to result in a defined predetermination of the illumination light beam firstly in conjunction with a good thermal loading capacity of the stop.

In an aspect, the disclosure provides a stop for arrangement at a constriction of an EUV illumination light beam between an EUV light source for EUV illumination light and an EUV illumination optical unit. The stop includes: a beam entrance section having a cross section that decreases in the propagation direction of the EUV illumination light beam; a beam exit section having a cross section that increases in the propagation direction of the EUV illumination light beam; and a beam tube section, arranged between the beam entrance section and the beam exit section, having a cross section that is constant in the propagation direction of the EUV illumination light beam. An inner wall of the beam tube section is embodied as reflective for the EUV illumination light.

It has been recognized according to the disclosure that a beam tube section between the beam entrance section and the beam exit section leads to the possibility firstly of a course of the EUV illumination light beam to be used being predetermined in a very defined way, and secondly can serve to provide a larger stop interaction area in the region of the constriction, with the consequence of an increased thermal loading capacity of the stop. The constriction in which the stop is able to be arranged can be an intermediate focus of a beam path of the EUV illumination light beam. The EUV illumination light beam can then be defined well, which can be used for imaging the then well defined constriction in the further course of a beam path, such as for providing an advantageously small degree of pupil filling within an EUV projection exposure apparatus. A well defined illumination angle distribution of an illumination of an object field of the projection exposure apparatus and accordingly a very good structure resolution during projection exposure can be the consequence. The inner wall of the beam tube section can be embodied as absorbent for radiation and/or debris portions that are entrained undesirably with the EUV illumination light. An effective dissipation of heat brought about on account of absorption of undesired light or radiation portions can take place by way of the beam tube section.

The stop makes it possible to realize an effect for transmitted EUV illumination light which practically does not alter a light distribution within the transmitted EUV illumination light beam, or alters it as little as possible.

The EUV illumination light for which the inner wall of the beam tube section is embodied as reflective can have a wavelength in the range of between 5 nm and 30 nm.

An inner wall of the beam entrance section is embodied as absorbent for the EUV illumination light. This provides for a good separating effect of the stop and also for a good beam shaping effect.

An inner wall of the beam entrance section can be embodied as absorbent for the EUV illumination light, and/or an inner wall of the beam exit section is embodied as absorbent for the EUV illumination light. Such an absorbent inner wall can provide for a good separating effect of the stop and also for a good beam shaping effect. The inner wall of the entrance section and/or the inner wall of the exit section can be embodied as absorbent for radiation and/or debris portions that are entrained undesirably with the EUV illumination light.

The beam tube section can have a circular cross section. Such a cross section of the beam tube section can have corresponding advantages with regard to the separating effect and the beam shaping effect.

For a beam tube section having a circular cross section, the length/radius ratio can be greater than 1.0. Such a beam tube section has proved to be particularly suitable for a good beam shaping effect with at the same time a good separating effect and good heat dissipation. The length/radius ratio can be greater than 1.5 (e.g., greater than 2.0, greater than 2.5). The length/radius ration can be less than 10 (e.g., less than 5, less than 3).

The beam entrance section and/or the beam exit section can have a conically extending inner wall. Such a conically extending inner wall has proved to be a particularly suitable shape. A cone angle of the inner wall of the entrance section and/or of the exit section can be adapted to a divergence angle of the illumination light beam, that is to say to a numerical aperture of an intermediate focus present at the constriction.

A cone angle of the inner wall of the beam entrance section can be exactly equal in magnitude to a cone angle of the inner wall of the beam exit section. Such a configuration of the cone angles can provide for a good adaptation of the stop shape to the beam divergence.

An inner wall transition region between the beam entrance section and the beam tube section and/or between the beam tube section and the beam exit section can be configured in a rounded fashion. Such a rounded transition region can avoid local heat spikes in these transition regions.

A rounded transition region can be embodied as absorbent. Such an absorbent embodiment of the transition region can avoid the generation of undesired stray light. The transition region can be embodied as absorbent both for the EUV illumination light and for undesired light or radiation portions.

Features of an illumination system described herein, an optical system described herein, a projection exposure apparatus described herein, a method described herein for producing a microstructured or nanostructured component, and such a microstructured or nanostructured component can correspond to those which have already been explained above with reference to the stop according to the disclosure. The component can be a semiconductor chip, for example a memory chip.

BRIEF DESCRIPTION OF THE DRAWINGS

Exemplary embodiments of the disclosure are explained in greater detail below with reference to the drawings, in which.

DESCRIPTION OF EXEMPLARY EMBODIMENTS

Figure 1:
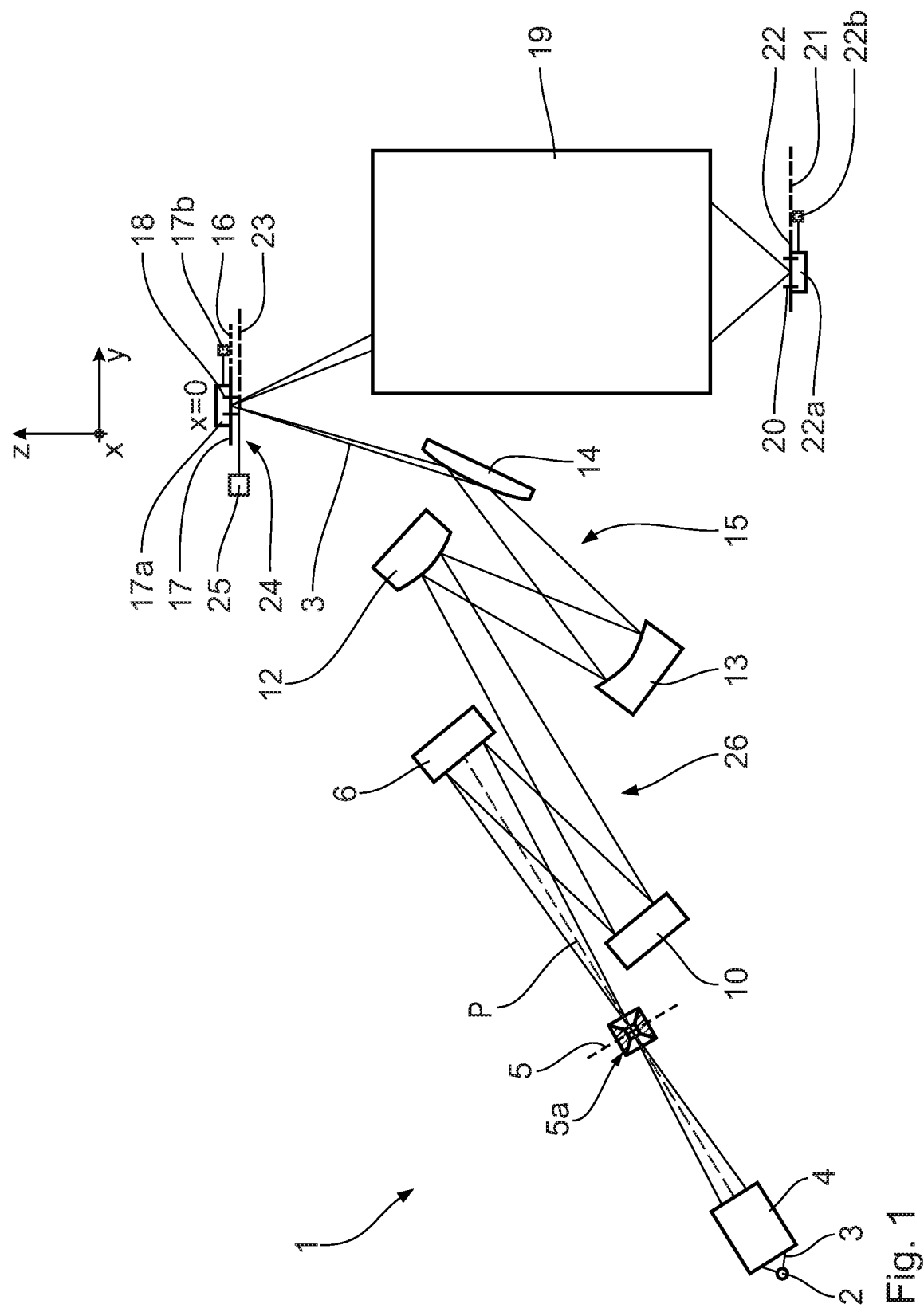
FIG. 1 shows a microlithographic projection exposure apparatus schematically and with regard to an illumination optical unit in a meridional section.

A projection exposure apparatus 1 for microlithography serves for producing a microstructured or nanostructured electronic semiconductor component. A light source 2 emits EUV radiation used for illumination in the wavelength range of, for example, between 5 nm and 30 nm. The light source 2 can be a GDPP (gas discharge produced plasma) source or an LPP (laser produced plasma) source. A radiation source based on a synchrotron can also be used for the light source 2. Information concerning such a light source can be found by the person skilled in the art in U.S. Pat. No. 6,859,515 B2, for example. EUV illumination light or illumination radiation in the form of an imaging light beam 3 is used for illumination and imaging within the projection exposure apparatus 1. The imaging light beam 3 downstream of the light source 2 firstly passes through a collector 4, which can be, for example, a nested collector having a multi-shell construction known from the prior art, or alternatively an ellipsoidally shaped collector then arranged downstream of the light source 2. A corresponding collector is known from EP 1 225 481 A and from U.S. Pat. No. 9,298,110 B2. Downstream of the collector 4, the EUV illumination light 3 firstly passes through an intermediate focal plane 5, which can be used for separating the imaging light beam 3 from undesirable radiation or particle portions. Arranged in the intermediate focal plane 5 is an intermediate focus stop 5a, which is illustrated in an axial longitudinal sectional view and is explained in even greater detail below. After passing through the intermediate focal plane 5, the imaging light beam 3 firstly impinges on a field facet mirror 6.

In order to facilitate the description of positional relationships, a Cartesian global xyz-coordinate system is depicted in the drawing. In FIG. 1, the x-axis runs perpendicularly to the plane of the drawing and out of the latter. The y-axis runs toward the right in FIG. 1. The z-axis runs upward in FIG. 1.

The separation of undesired radiation portions from the imaging light beam 3, provided that the undesired radiation portions differ from the desired imaging light in wavelength, can be facilitated if the collector 4 guides such radiation portions differently than the desired imaging light. Such collectors are known from U.S. Pat. No. 8,198,613 B2.

Field facets of the field facet mirror 6, which are not illustrated in the drawing, can be rectangular or arcuate and each have the same x/y aspect ratio. The x/y aspect ratio can be for example 12/5, can be 25/4, can be 104/8, can be 20/1 or can be 30/1.

The field facets predetermine a reflection surface of the field facet mirror 6 and are grouped for example in a plurality of columns to form in each case a plurality of field facet groups.

After reflection at the field facet mirror 6, the imaging light beam 3 split into imaging light partial beams assigned to the individual field facets impinges on a pupil facet mirror 10. The respective imaging light partial beam of the entire imaging light beam 3 is guided along a respective imaging light channel.

The pupil facets of the pupil facet mirror 10, which are likewise not illustrated in the drawing, can be arranged e.g. around a center in facet rings lying one in another. A pupil facet is assigned to each imaging light partial beam of the EUV illumination light 3 which is reflected by one of the field facets, such that a respective facet pair impinged upon and including one of the field facets and one of the pupil facets predefines the imaging light channel for the associated imaging light partial beam of the EUV illumination light 3. The channel-by-channel assignment of the pupil facets to the field facets is effected depending on a desired illumination by the projection exposure apparatus 1. Such a channel-by-channel assignment is explained in greater detail for example in US 2015/0015865 A1.

Via the pupil facet mirror 10 (FIG. 1) and a downstream transfer optical unit 15 consisting of three EUV mirrors 12, 13, 14, the field facets are imaged into an object plane 16 of the projection exposure apparatus 1. The EUV mirror 14 is embodied as a mirror for grazing incidence (grazing incidence mirror). Arranged in the object plane 16 is a reticle 17, from which, with the EUV illumination light 3, an illumination region is illuminated which coincides with an object field 18 of a downstream projection optical unit 19 of the projection exposure apparatus 1. The illumination region is also referred to as an illumination field. The object field 18 is rectangular or arcuate depending on the concrete embodiment of an illumination optical unit of the projection exposure apparatus 1. The imaging light channels are superimposed in the object field 18. The EUV illumination light 3 is reflected from the reticle 17. The reticle 17 is held by an object holder 17a, which is displaceable in a driven manner along the displacement direction y with the aid of an object displacement drive 17b indicated schematically.

The projection optical unit 19 images the object field 18 in the object plane 16 into an image field 20 in an image plane 21. Disposed in the image plane 21 is a wafer 22 bearing a light-sensitive layer, which is exposed during the projection exposure via of the projection exposure apparatus 1. The wafer 22, that is to say the substrate onto which imaging is effected, is held by a wafer or substrate holder 22a, which is displaceable along the displacement direction y synchronously with the displacement of the object holder 17a with the aid of a wafer displacement drive 22b likewise indicated schematically. During the projection exposure, both the reticle 17 and the wafer 22 are scanned in a synchronized manner in the y-direction. The projection exposure apparatus 1 is embodied as a scanner. The scanning direction y is the object displacement direction.

Arranged in a correction plane 23 is an illumination intensity correction device 24, the construction and function of which are described for example in US 2015/0015865 A1. The correction device 24 is driven by a control unit 25. Further examples of a correction device are known from WO 2009/074 211 A1, EP 0 952 491 A2 and from DE 10 2008 013 229 A1.

The field facet mirror 6, the pupil facet mirror 10, the mirrors 12 to 14 of the transfer optical unit 15 and the correction device 24 are parts of an illumination optical unit 26 of the projection exposure apparatus 1. Together with the projection optical unit 19, the illumination optical unit 26 forms an illumination system of the projection exposure apparatus 1.

Figure 2:
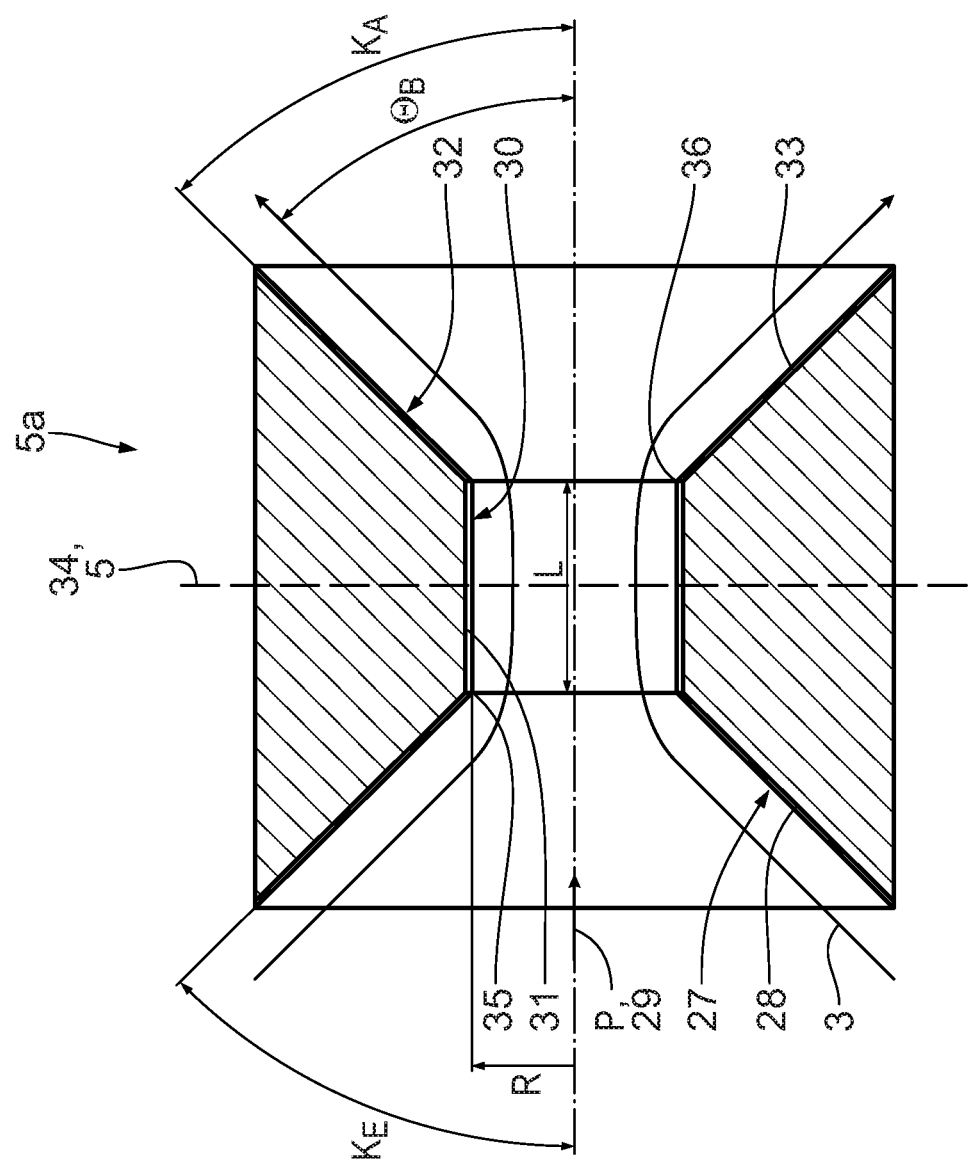
FIG. 2 shows in an enlarged view in axial section a constriction or intermediate focus stop of the illumination optical unit of the projection exposure apparatus according to FIG. 1.

FIG. 2 shows the intermediate focus stop 5a in greater detail. The intermediate focus stop 5a is arranged in the intermediate focal plane 5. The intermediate focus stop 5a serves for arrangement at a constriction, that is to say e.g. at an intermediate focus, of the EUV illumination light beam 3 between the light source 2 and the illumination optical unit 26.

The stop 5a has a beam entrance section 27, into which the illumination light beam 3, coming from the collector 4, enters into the stop 5a. A main propagation direction of the illumination light beam 3 through the stop 5a is designated by P in FIGS. 1 and 2.

A separation between the used light, that is to say the illumination light beam 3, and undesirably entrained light or radiation or debris portions takes place at the stop 5a. The undesirably entrained light portions for example may have the wavelength of the illumination light 3, but may not pass within the divergence of the illumination light beam 3. The undesired radiation portions may have a different wavelength than the illumination light 3.

The entrance section 27 of the stop 5a has a cross section that decreases in the propagation direction P. The beam entrance section 27 has an inner wall 28 extending in a conically tapering fashion. the inner wall 28 of the beam entrance section 27 is embodied as absorbent for the illumination light 3 and for undesirably entrained light or radiation portions. An absorbent coating or absorbent film suitable for this purpose is known from U.S. Pat. No. 9,200,359 B2 and the references cited therein.

A cone angle $K_E$ of the inner wall 28 is defined as the angle between a sectional line of the inner wall 28 in the axial longitudinal sectional view illustrated in FIG. 2 and the axial longitudinal axis 29 of the stop 5a. the longitudinal axis 29 coincides with the propagation direction P.

The stop 5a has a beam tube section 30 downstream of the entrance section 27 in the propagation direction P. The tube section 30 has a cross section that is constant in the propagation direction P. An inner wall 31 of the tube section 30 is embodied as reflective, and in particular highly reflective, for the illumination light 3.

The inner wall 31 can have a ruthenium coating, for example, as a highly reflective coating.

The inner wall 31 can have an absorbent effect for the undesired radiation portions by virtue of the fact that a material that is reflective for the illumination light 3 has applied to it a material that is absorbent for other wavelength ranges. Such materials are known from US 2004/0058253 A1, for example. The inner wall 31 can be structured such that undesired radiation portions (analogously to U.S. Pat. No. 8,198,613 B2 already cited) are reflected differently than the illumination light 3 and then absorbed later in the system, e.g. at the beam exit section 32 yet to be described.

The tube section 30 has a circular cross section having a radius R. The tube section 30 has a length L measured along the longitudinal axis 29, that is to say in the propagation direction P. A ratio of the length L and the radius R of the tube section 30 is greater than 1.0. The radius R has in absolute terms a magnitude in the range of between 2 mm and 5 mm.

The stop 5a has a beam exit section 32 downstream of the tube section 30 in the propagation direction P. The exit section 32 has a cross section that increases in the propagation direction P. An inner wall 33 of the exit section 32 is embodied as absorbent for the illumination light 3 and the undesired radiation portions. The inner wall 33 extends in the propagation direction P in a conically widening fashion with a cone angle $K_A$ between the sectional line of the inner wall 33 and the longitudinal axis 29. The following holds true in the case of the embodiment according to FIG. 2: $K_E = K_A$. Alternatively, the cone angles $K_E$, $K_A$ can also differ from one another.

The intermediate focus stop 5a is mirror-symmetrical overall with respect to a central plane 34 that is perpendicular to the longitudinal axis 29. The central plane 34 coincides with the intermediate focal plane 5.

A transition edge region 35, 36 of the inner walls of the stop 5a firstly between the entrance section 27 and the tube section 30 and secondly between the tube section 30 and the exit section 32 is configured in each case as absorbent for the EUV illumination light 3 and for the undesired radiation portions.

Said edge region 35, 36 can be produced with a transition edge.

FIG. 2 additionally illustrates the course of the illumination light beam 3 through the intermediate focus stop 5a. The course of an extent of the illumination light beam 3 having a focus in the intermediate focal plane 5 in the tube section 30 is illustrated in the longitudinal sectional view.

A divergence angle of the illumination light beam 3, which is equal in magnitude upstream and downstream of the focus, is illustrated at $\Theta_B$ in FIG. 2. The following holds true in the case of the embodiment illustrated: $\Theta_B = K_E = K_A$. The cone angles $K_E$, $K_A$ of the entrance section 27 and of the exit section 32 of the stop 5a are thus adapted to the divergence angle $\Theta_B$ of the illumination light beam 3. Alternatively, the cone angle $K_E$ and/or the cone angle $K_A$ can also differ from the divergence angle $\Theta_B$.

No detailed course of rays of the illumination light beam 3 is depicted in FIG. 2, for the sake of better clarity. A portion of the rays of the illumination light beam 3 will pass through the intermediate focus 5 without a reflection taking place at the inner wall 31. The proportion of the total illumination light beam 3 that is constituted by the rays is all the greater for a given numerical aperture at the intermediate focus, the smaller the ratio L/R. As the ratio L/R rises, the proportion constituted by the rays that are reflected at the inner wall 31 becomes greater. In particular, the proportion constituted by the rays that are reflected at the inner wall 31 more than once also becomes greater as the ratio L/R rises.

The number of maximum reflections of the EUV illumination light 3 at the inner wall 31 can be greater than 1, can be greater than 2, can be greater than 3, can be greater than 4. This number of reflections is in general at most 5.

Insofar as these undesired radiation portions of other wavelengths pass within the divergence of the illumination light beam 3, it is desirable to configure the tube section 30 with a ratio L/R having a magnitude such that at least one reflection of the undesired radiation portions takes place at the inner wall 31, preferably a plurality of such reflections.

Undesired light or radiation portions are additionally absorbed at the absorbent inner walls 28 and 33 of the entrance section 27 and of the exit section 32.

Debris portions are blocked by the stop 5a, which then has a mechanical effect.

KE and/or KA can be in the range of between 5° and 30°. KE and/or KA can be in particular in the range of between 8.63° and 14.48°, which corresponds to a numerical aperture in the intermediate focus of the illumination light beam 3 of between 0.15 and 0.25. KE and/or KA can have in particular a value of approximately 8.6°, 9.2°, 9.8°, 10.4°, 11.0°, 11.5°, 12.1°, 12.7°, 13.3°, 13.9° or 14.5°, which corresponds to a numerical aperture in the intermediate focus of the illumination light beam 3 of 0.15, 0.16, 0.17, 0.18, 0.19, 0.20, 0.21, 0.22, 0.23, 0.24 or 0.25.

The angles $K_E$, $K_A$ and $\Theta_B$ are thus not illustrated to scale in FIG. 2.

An angle of incidence of the illumination light beam 3 on the inner wall 31 can be greater than 60°, can be greater than 65°, can be greater than 70°, can be greater than 75°, can be greater than 80° and can be in particular even greater. In the case of such angles of grazing incidence, the reflectivity of the highly reflective coating of the inner wall 31 is particularly good and, depending on the angle of incidence, can be greater than 80%, can be greater than 85% and can even be greater than 90%.

The maximum angle of incidence of the illumination light beam 3 on the inner wall 31 is typically given by 90° minus the numerical aperture in the intermediate focus of the illumination light beam. A small numerical aperture in the intermediate focus of the illumination light beam 3 is therefore useful in order to achieve a high reflectivity of the coating of the inner wall 31.

Upon passing through the intermediate focus stop 5a, the illumination light beam 3 can have a used power of more than 100 W, for example of 500 W. The power of the undesired light and radiation portions can have the same order of magnitude.

Figure 3:
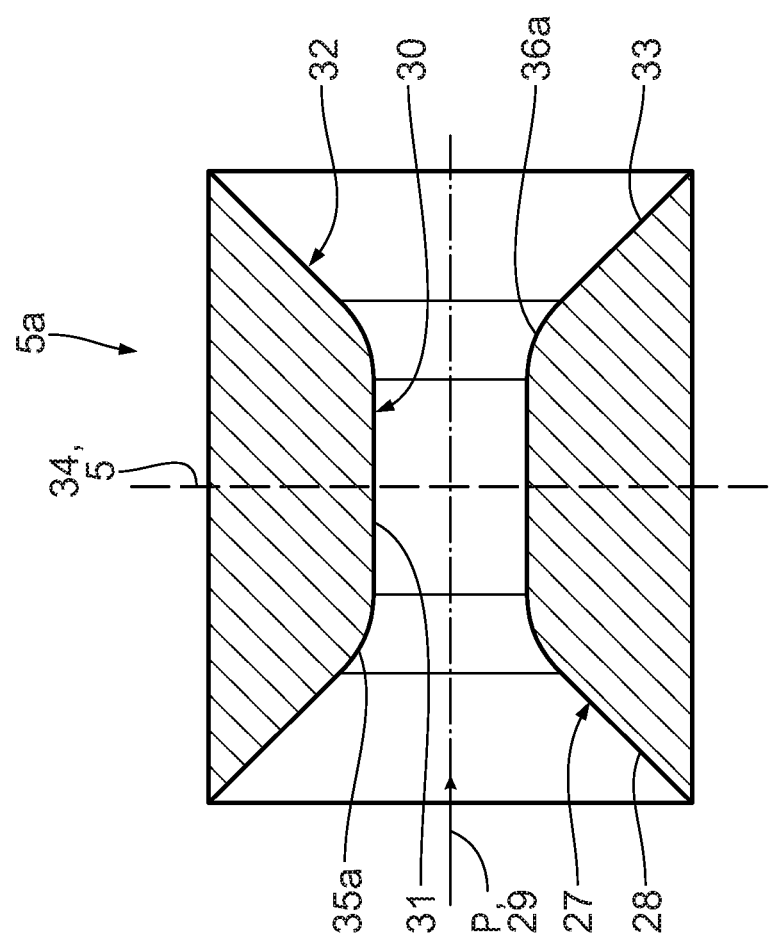
FIG. 3 shows a further embodiment of an intermediate focus stop, which can be used instead of that according to FIG. 2 in the illumination optical unit of the projection exposure apparatus according to FIG. 1.

FIG. 3 shows a further embodiment of the intermediate focus stop 5a. Components and functions corresponding to those which have already been explained above with reference to FIGS. 1 and 2, and particularly with reference to FIG. 2, bear the same designations and reference signs and will not be discussed in detail again.

Firstly between the entrance section 27 and the tube section 30 and secondly between the tube section 30 and the exit section 32, the edge transition regions 35a, 36a are embodied as rounded in the case of the stop 5a according to FIG. 3. These rounded transition regions 35a, 36a are embodied as absorbent for the illumination light 3 and for other entrained wavelengths.

Depending on the embodiment of the stop 5a, the ratio L/R is in the range of between 0.5 and 3. In general this ratio L/R is at least 1.0.

During the projection exposure, firstly the reticle 17 and the wafer 22, which bears a coating that is light-sensitive to the illumination light 3, are provided. Subsequently, a portion of the reticle 17 is projected onto the wafer 22 with the aid of the projection exposure apparatus 1. Finally, the light-sensitive layer on the wafer 22 that has been exposed with the illumination light 3 is developed. A microstructured or nanostructured component, for example a semiconductor chip, is produced in this way.

What is claimed is:

1. A stop, comprising:
    a beam entrance section;
    a beam exit section; and
    a beam tube section between the beam entrance section and the beam exit section,
    wherein:
        the stop is configured to have a beam of EUV light propagate through the stop along a propagation direction;
        a cross section of the beam entrance section decreases in the propagation direction;
        a cross section of the beam exit section increases in the propagation direction;
        a cross section of the beam tube section is constant in the propagation direction;
        an inner wall of the beam tube section is reflective for the EUV light; and
        an inner wall of the beam entrance section is absorbent for the EUV light.

2. The stop of claim 1, wherein an inner wall of the beam exit section is absorbent for the EUV light.

3. The stop of claim 1, wherein the inner wall of the beam entrance section is absorbent for radiation and/or debris portions undesirably entrained with the EUV light.

4. The stop of claim 3, wherein an inner wall of the beam exit section is absorbent for the radiation and/or the debris portions undesirably entrained with the EUV light.

5. The stop of claim 1, wherein an inner wall of the beam exit section is absorbent for the radiation and/or the debris portions undesirably entrained with the EUV light.

6. The stop of claim 5, wherein the inner wall of the beam exit section is absorbent for the EUV light.

7. The stop of claim 1, wherein the beam tube section has a circular cross section.

8. The stop of claim 7, wherein, along the propagation direction, a ratio of a length of the circular cross section to a radius of the circular cross section is greater than 1.0.

9. The stop of claim 1, wherein the inner wall of the beam entrance section is a conically extending inner wall.

10. The stop of claim 9, wherein the inner wall of the beam exit section is a conically extending inner wall.

11. The stop of claim 10, wherein a cone angle of the inner wall of the beam entrance section is exactly equal in magnitude to a cone angle of the inner wall of the beam exit section.

12. The stop of claim 1, wherein the inner wall of the beam exit section is a conically extending inner wall.

13. The stop of claim 1, wherein the stop comprises a rounded an inner wall transition region between the beam entrance section and the beam tube section, and or a rounded an inner wall transition region between the beam tube section and the beam exit section.

14. The stop of claim 13, wherein the rounded inner wall transition region is absorbent for the EUV light.

15. The stop of claim 1, wherein the stop is configured to be disposed at a constriction between an EUV light source for the EUV light and an EUV illumination optical unit.

16. An illumination system, comprising:
    an illumination optical unit; and a stop according to claim 1 disposed at a constriction of the illumination system.

17. An illumination system, comprising:

an EUV light source;

a collector; and a stop according to claim 1, wherein the collector is between the EUV light source and the stop along a propagation direction of EUV light through the illumination system.

18. An optical system, comprising:

an illumination system configured to illuminate an object field;

a projection optical unit configured to image the object field into an image field; and a stop according to claim 1 at a constriction in the illumination system.

19. An apparatus, comprising:

an EUV light source;

an illumination system configured to illuminate an object field;

a projection optical unit configured to image the object field into an image field; and a stop according to claim 1 disposed at a constriction in the illumination system.

20. A method of using an apparatus comprising an illumination system and a projection optical unit, the method comprising:

using the illumination system to illuminate an object field; and using the projection optical unit to image the object field into an image field, wherein the illumination system comprises a stop according to claim 1 disposed at a constriction in the illumination system.

* * * * *

UNITED STATES PATENT AND TRADEMARK OFFICE
CERTIFICATE OF CORRECTION

| | | |
|---|---|---|
| PATENT NO. | : 11,350,513 B2 | Page 1 of 1 |
| APPLICATION NO. | : 17/102976 | |
| DATED | : May 31, 2022 | |
| INVENTOR(S) | : Michael Patra | |

It is certified that error appears in the above-identified patent and that said Letters Patent is hereby corrected as shown below:

In the Claims

Column 6, Line 58, Claim 13, delete "and or" insert -- and/or --.

Signed and Sealed this
Second Day of August, 2022

Katherine Kelly Vidal
*Director of the United States Patent and Trademark Office*